(12) United States Patent
Mukunoki et al.

(10) Patent No.: US 12,225,675 B2
(45) Date of Patent: Feb. 11, 2025

(54) CONNECTION STRUCTURE

(71) Applicants: Mitsubishi Electric Corporation, Tokyo (JP); TOSHIBA MITSUBISHI-ELECTRIC INDUSTRIAL SYSTEMS CORPORATION, Tokyo (JP)

(72) Inventors: Yasushige Mukunoki, Tokyo (JP); Takeshi Horiguchi, Tokyo (JP); Hiroki Shigeta, Tokyo (JP)

(73) Assignees: MITSUBISHI ELECTRIC CORPORATION, Tokyo (JP); TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 185 days.

(21) Appl. No.: 18/022,752

(22) PCT Filed: Sep. 3, 2020

(86) PCT No.: PCT/JP2020/033436
§ 371 (c)(1),
(2) Date: Feb. 23, 2023

(87) PCT Pub. No.: WO2022/049695
PCT Pub. Date: Mar. 10, 2022

(65) Prior Publication Data
US 2023/0320014 A1    Oct. 5, 2023

(51) Int. Cl.
*H05K 7/14*    (2006.01)
*H05K 1/02*    (2006.01)
*H05K 9/00*    (2006.01)

(52) U.S. Cl.
CPC ......... *H05K 7/1407* (2013.01); *H05K 1/0215* (2013.01); *H05K 9/0007* (2013.01); *H05K 7/1432* (2013.01)

(58) Field of Classification Search
CPC .. H05K 7/1407; H05K 1/0215; H05K 9/0007; H05K 7/1432
(Continued)

(56) References Cited

U.S. PATENT DOCUMENTS

| 2007/0076390 | A1* | 4/2007 | Kroener | H01L 23/3733 |
| | | | | 257/E21.705 |
| 2014/0182896 | A1 | 7/2014 | Lee et al. | |
| 2014/0211425 | A1* | 7/2014 | Yu | H05K 1/0274 |
| | | | | 361/748 |

FOREIGN PATENT DOCUMENTS

JP    2003-133779 A    5/2003
KR    20140087744    7/2014

OTHER PUBLICATIONS

International Search Report and Written Opinion mailed on Nov. 24, 2020, received for PCT Application PCT/JP2020/033436, filed on Sep. 3, 2020, 9 pages including English Translation.
(Continued)

*Primary Examiner* — Andargie M Aychillhum
(74) *Attorney, Agent, or Firm* — XSENSUS LLP

(57) ABSTRACT

A connection structure includes a circuit board, an insulating member, a housing, and a conductive wire. The insulating member includes a first portion and a second portion. The first portion is fixed to the circuit board. The second portion faces the first portion. The second portion is fixed to the housing. The housing includes a grounded contact. The conductive wire electrically connects the circuit board and the housing while being wound around the insulating member. A shortest distance along a surface of the housing from a position where the conductive wire and the housing are connected to the contact is shorter than a shortest distance along a surface of the housing from the second portion of the insulating member to the contact.

8 Claims, 5 Drawing Sheets

(58) Field of Classification Search
USPC .......................................................... 361/748
See application file for complete search history.

(56) References Cited

OTHER PUBLICATIONS

Korean Office Action issued Jul. 24, 2024, in corresponding Korean Patent Application No. 10-2023-7005635, 9pp.

* cited by examiner

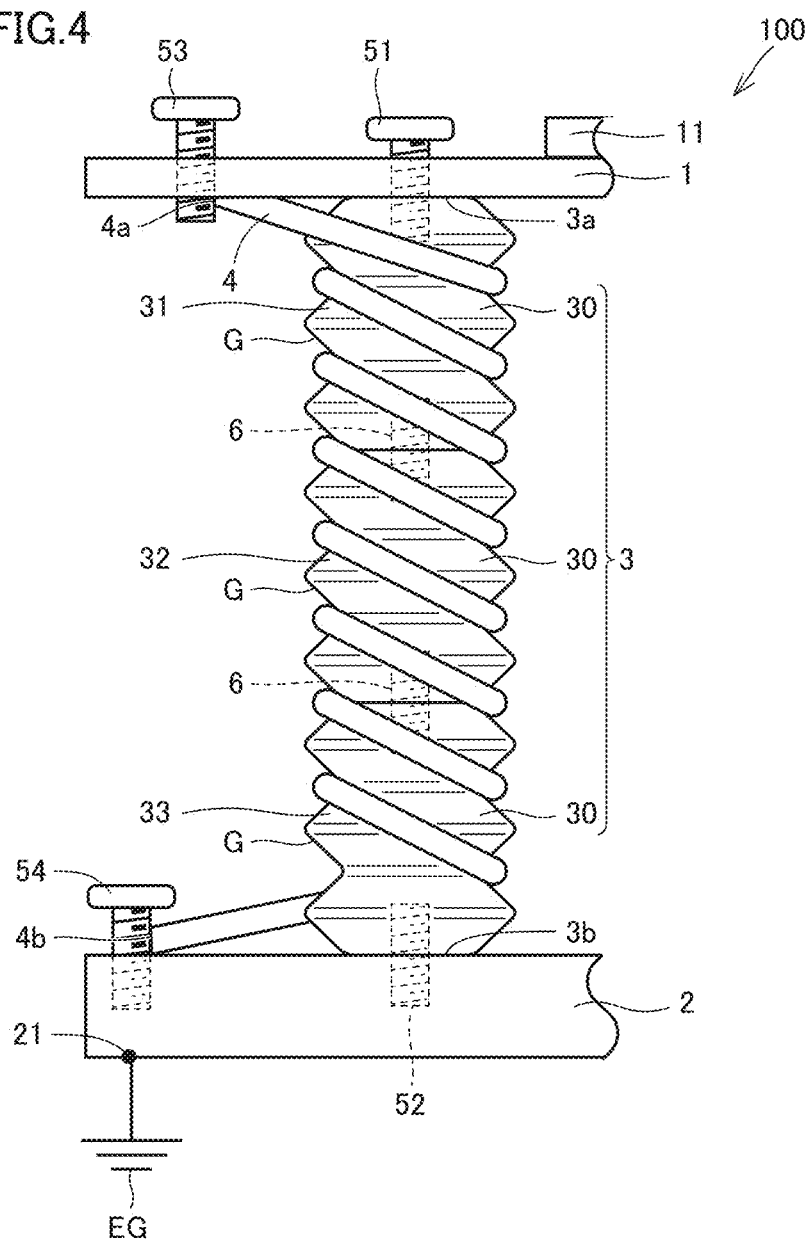

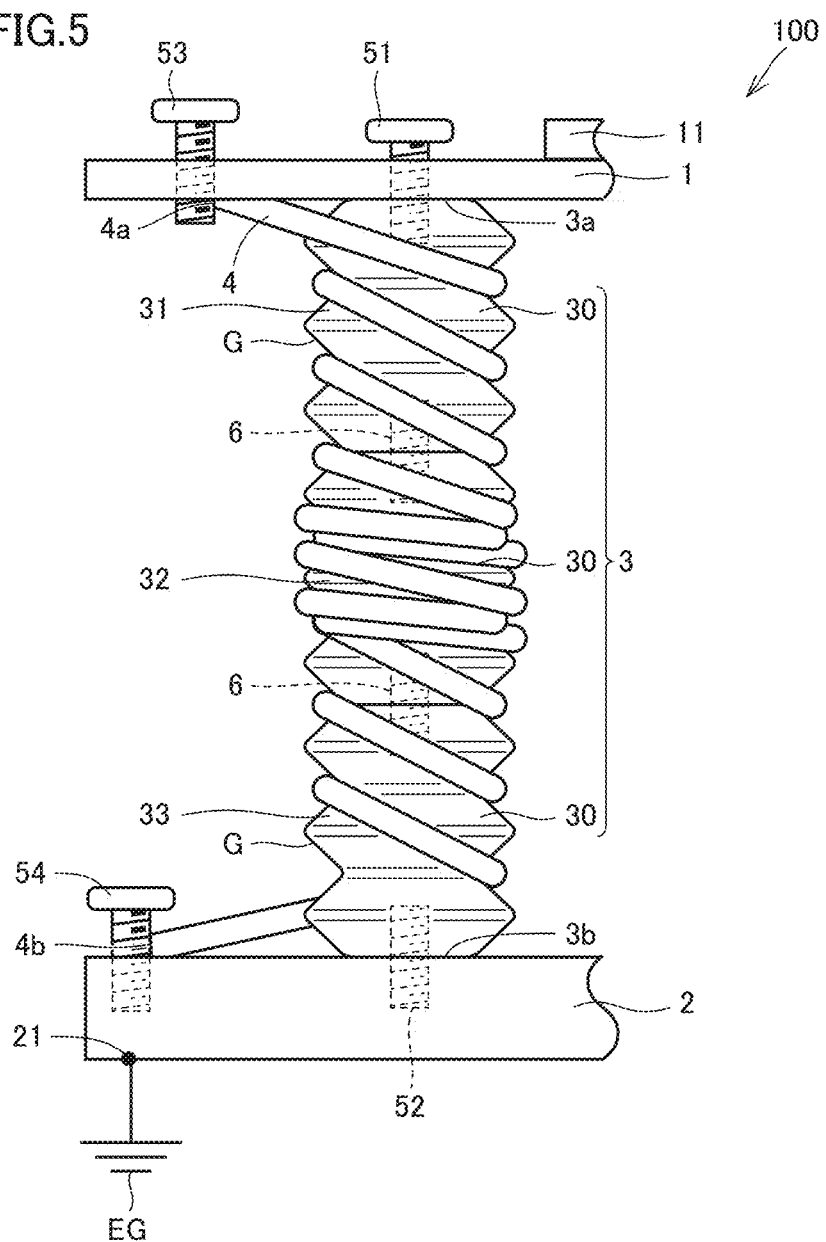

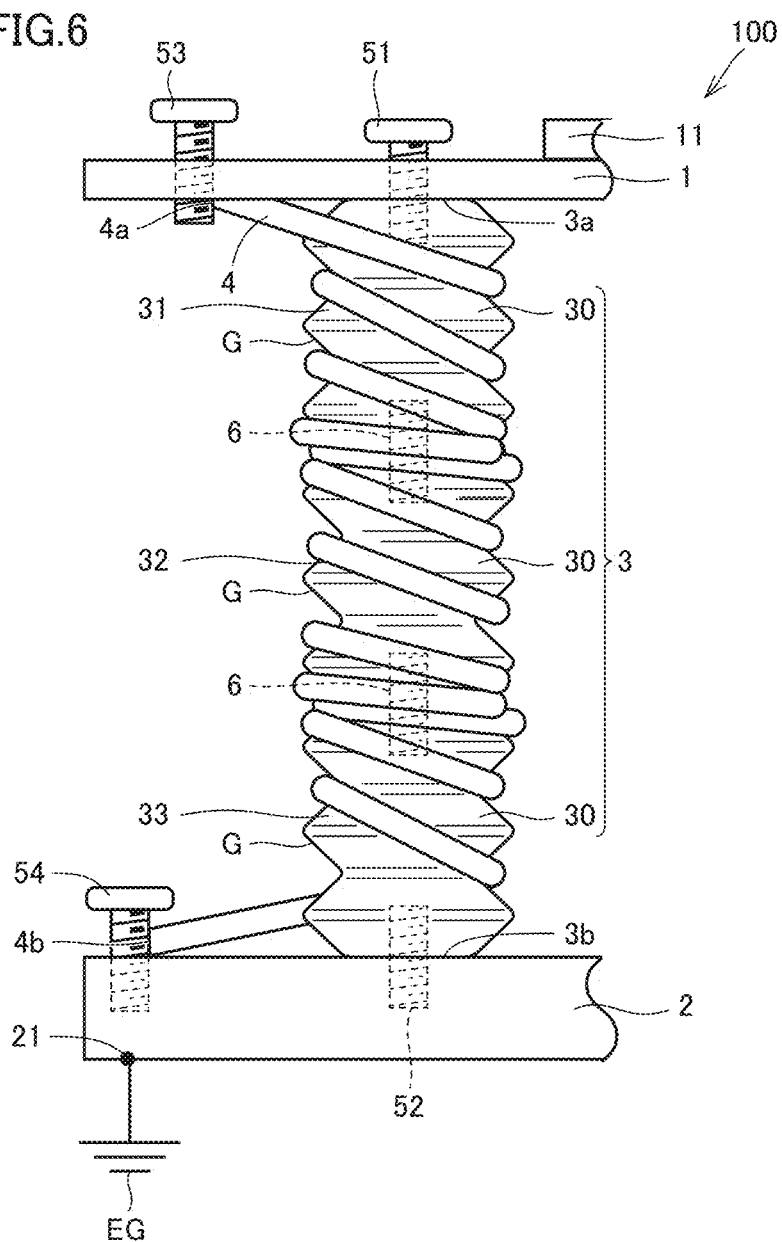

CONNECTION STRUCTURE

CROSS-REFERENCE TO RELATED APPLICATION

The present application is based on PCT filing PCT/JP2020/033436, filed Sep. 3, 2020, the entire contents of which are incorporated herein by reference.

TECHNICAL FIELD

The present disclosure relates to a connection structure.

BACKGROUND ART

When a power converter such as a switching power supply is mounted on a circuit board, a high-frequency noise current due to a switching operation of the power converter is generated. The high-frequency noise current transmits a place having a low high-frequency impedance. For example, parasitic capacitance of the circuit board has the low high-frequency impedance. The circuit board is connected to a housing grounded for safety by a conductive connection member. For this reason, the high-frequency noise current flows from the circuit board to the ground through the connection member and the housing. The high-frequency noise current flowing out to the ground degrades electromagnetic compatibility (EMC) of an electric apparatus as a common mode current. The high-frequency noise current flowing through the housing induces radiation noise, which degrades the electromagnetic compatibility of the electric apparatus.

For example, in a connection structure between the circuit board and the housing described in Japanese Patent Laying-Open No. 2003433779 (PTL 1), a core of a screw that connects the circuit board and the housing is an insulating material. A tap (screw thread) of the screw has conductivity. For this reason, the connection structure between the circuit board and the housing has a high inductance component. This connection structure between the circuit board and the housing acts as inductance that prevents the high-frequency noise current flowing from the circuit board to the housing, so that unnecessary radiation noise (radiation noise) is reduced.

CITATION LIST

Patent Literature

PTL 1: Japanese Patent Laying-Open No. 2003-133779

SUMMARY OF INVENTION

Technical Problem

In the connection structure between the circuit board and the housing described in PTL 1, the tap (screw thread) having conductivity is fixed to the core of the screw. For this reason, a connection place of the connection structure to the housing is limited to a position where the screw is fixed to the housing. Accordingly, when the position where the screw is fixed to the housing is away from the ground, a distance over which the high-frequency noise current flows along the surface of the housing becomes long.

Solution to Problem

A connection structure of the present disclosure includes a circuit board, an insulating member, a housing, and a conductive wire. The insulating member includes a first portion and a second portion. The first portion is fixed to the circuit board. The second portion faces the first portion. The second portion is fixed to the housing. The housing includes a contact. The contact is grounded. The conductive wire electrically connects the circuit board and the housing while being wound around the insulating member. A shortest distance along a surface of the housing from a position where the conductive wire and the housing are connected to the contact is shorter than a shortest distance along a surface of the housing from the second portion of the insulating member to the contact.

Advantageous Effects of Invention

According to the connection structure of the present disclosure, the shortest distance along the surface of the housing from the position where the conductive wire and the housing are connected to the contact is shorter than the shortest distance along the surface of the housing from the second portion of the insulating member to the contact. Consequently, the distance over which the high-frequency noise current flows along the surface of the housing can be shortened.

BRIEF DESCRIPTION OF DRAWINGS

FIG. 4 is a partial side view schematically illustrating a configuration of a connection structure according to a third embodiment.

FIG. 5 is a partial side view schematically illustrating a configuration of a connection structure according to a fourth embodiment.

FIG. 6 is a partial side view schematically illustrating a configuration of a connection structure according to a fifth embodiment.

DESCRIPTION OF EMBODIMENTS

Figure 1:
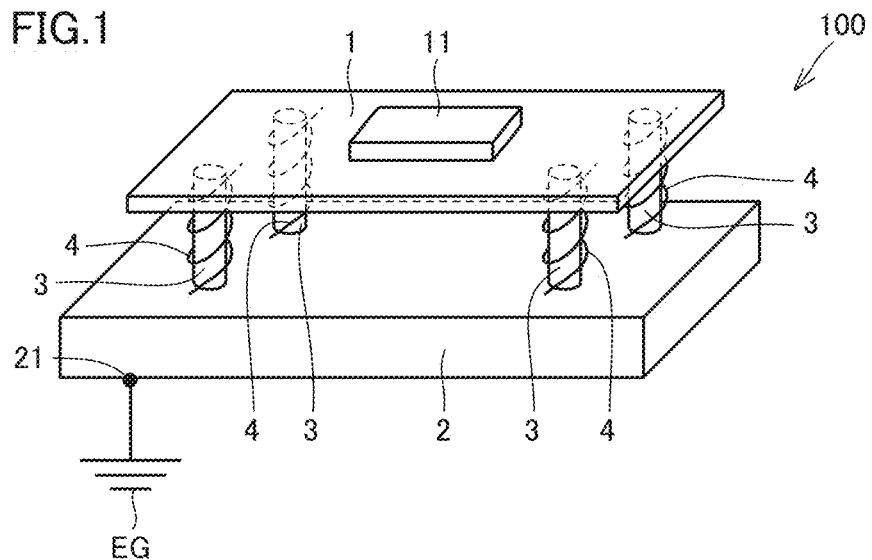
FIG. 1 is a perspective view schematically illustrating a configuration of a connection structure according to a first embodiment.

Hereinafter, embodiments will be described with reference to the drawings. In the following description, the same or corresponding parts are denoted by the same reference numerals, and overlapping description will not be repeated.

First Embodiment

Figure 2:
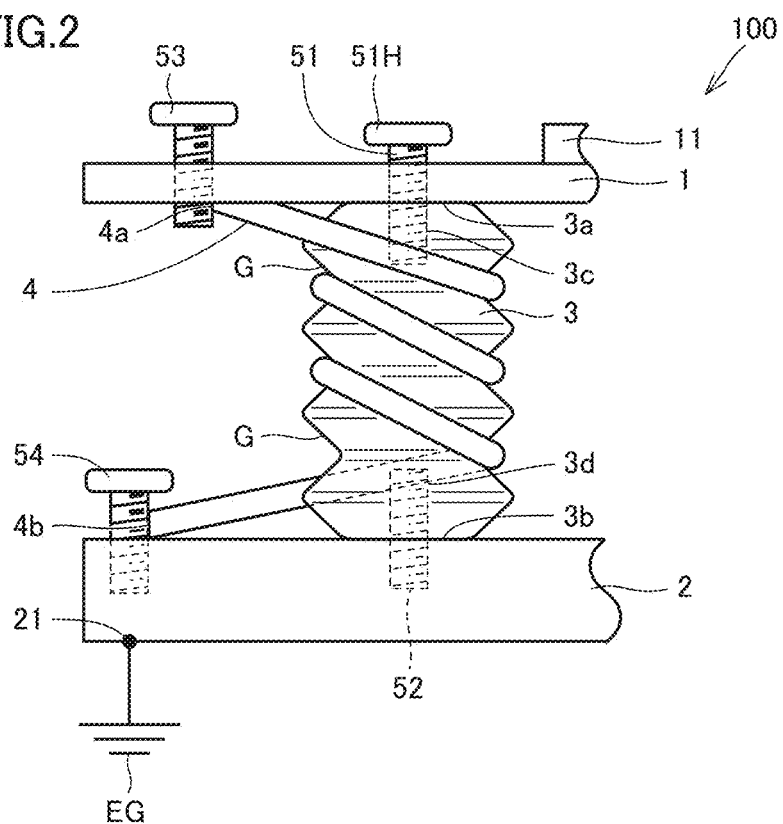
FIG. 2 is a partial side view of the connection structure in FIG. 1.

With reference to FIGS. 1 and 2, a configuration of a connection structure 100 according to a first embodiment will be described below.

As illustrated in FIG. 1, connection structure 100 includes a circuit board 1, a housing 2, an insulating member 3, and a conductive wire 4. Circuit board 1 and housing 2 are included in an internal structure of an electric apparatus. For example, the electric apparatus is a power conversion device. For example, the power conversion device is an uninterruptible power supply device, a large-capacity air conditioner, or the like. In the first embodiment, circuit board 1 and housing 2 face each other. Circuit board 1 may be accommodated inside housing 2.

A power converter 11 is mounted on circuit board 1. For example, power converter 11 is a switching power supply. Power converter 11 includes a power conversion semiconductor element (not illustrated). For example, the power conversion semiconductor element is a metal oxide semiconductor field effect transistor (MOSFET) made of silicon (Si). Power converter 11 is configured to convert a power supply voltage using a switching function of the power conversion semiconductor element. A heat sink (not illustrated) configured to cool the power conversion semiconductor element may be further mounted on circuit board 1.

For example, the switching power supply is used as a power supply circuit of the uninterruptible power supply device. In the first embodiment, the uninterruptible power supply device includes the power conversion semiconductor element. For example, circuit board 1 is used as the power supply circuit of a gate drive circuit configured to drive the power conversion semiconductor element of the uninterruptible power supply device.

Housing 2 includes a contact 21. Contact 21 is grounded. Contact 21 is electrically connected to a ground EG. Ground EG is not necessarily disposed at a flat position where circuit board 1 can be disposed. For example, ground HG may be disposed on a column (not illustrated) of housing 2. For this reason, ground EG is not necessarily disposed at a position where insulating member 3 can be fixed. For example, a material of housing 2 is metal. Housing 2 may constitute an outer shape of the electric apparatus.

In FIG. 1, four insulating members 3 and four conductive wires 4 are disposed between circuit board 1 and housing 2, and at least one insulating member 3 and at least one conductive wire 4 may be disposed between circuit board 1 and housing 2. Another connection member may be provided between circuit board 1 and housing 2. For example, the number and positions of insulating member 3 and conductive wire 4 may be determined according to a circuit structure of power converter 11 such as the switching power supply mounted on circuit board 1. In FIG. 2, one insulating member 3 and one conductive wire 4 are disposed between circuit board 1 and housing 2.

As illustrated in FIG. 2, insulating member 3 is sandwiched between circuit board 1 and housing 2. Insulating member 3 extends from circuit board 1 toward housing 2. Insulating member 3 extends along an axial direction. In the first embodiment, the axial direction of insulating member 3 is a direction along a direction from circuit board 1 toward housing 2.

Insulating member 3 includes a first portion $3a$ and a second portion $3b$. First portion $3a$ is fixed to circuit board 1. A first screw hole $3c$ is made in first portion $3a$. First screw hole $3c$ constitutes a female screw. Second portion $3b$ faces first portion $3a$. Second portion $3b$ is fixed to housing 2. A second screw hole $3d$ is made in second portion $3b$. Second screw hole $3d$ constitutes the female screw. Second portion $3b$ is fixed to housing 2.

In the first embodiment, insulating member 3 includes a groove G provided over an entire periphery of the outer periphery. Groove G is provided along a circumferential direction of insulating member 3. In the first embodiment, a plurality of grooves G are disposed in insulating member 3 along the axial direction of insulating member 3.

For example, insulating member 3 is an insulator. The insulator may be a general-purpose product. In the first embodiment, the general-purpose product is a component easily available to general consumers.

Conductive wire 4 electrically connects circuit board 1 and housing 2 while being wound around insulating member 3. Conductive wire 4 is wound along the circumferential direction of insulating member 3. In the first embodiment, conductive wire 4 is wound around insulating member 3 along groove G. Conductive wire 4 is configured to be deformable.

Conductive wire 4 includes a first end $4a$ and a second end $4b$. First end $4a$ is electrically connected to circuit board 1. First end $4a$ may be disposed away from first portion $3a$. In the first embodiment, first end $4a$ is disposed away from first portion $3a$. Second end $4b$ is electrically connected to housing 2. Second end $4b$ is disposed away from second portion $3b$. First end $4a$ and second end $4b$ are not fixed to insulating member 3.

The shortest distance along a surface of housing 2 from a position where conductive wire 4 and housing 2 are connected to contact 21 is shorter than the shortest distance along the surface of housing 2 from second portion $3b$ of insulating member 3 to contact 21. The shortest distance along the surface of housing 2 is a creepage distance of housing 2. The shortest distance from second end $4b$ to contact 21 along the surface of housing 2 is shorter than the shortest distance along the surface of housing 2 from second portion $3b$ of insulating member 3 to contact 21.

Conductive wire 4 has a winding structure because conductive wire 4 is wound around the outer periphery of insulating member 3. For this reason, conductive wire 4 has higher self-inductance than the case where conductive wire 4 extends linearly between circuit board 1 and housing 2. Impedance is proportional to the self-inductance. Accordingly, conductive wire 4 has high-frequency impedance higher than the case where conductive wire 4 has the linear shape. In the first embodiment, the high-frequency impedance is impedance in a high frequency region. Thus, a high-frequency noise current can be prevented from propagating from circuit board 1 to housing 2 through conductive wire 4.

Connection structure 100 further includes a first fastening body 51, a second fastening body 52, a third fastening body 53, and a fourth fastening body 54. The female screw to be screwed with first fastening body 51 and the female screw to be screwed with third fastening body 53 are provided in circuit board 1. The female screw to be screwed with second fastening body 52 and the female screw to be screwed with fourth fastening body 54 are provided in housing 2.

First fastening body 51 fixes first portion $3a$ and circuit board 1. First fastening body 51 is a first screw to be screwed into first screw hole $3c$. The first screw is a male screw. The first screw may be a general-purpose product. The material of first fastening body 51 is a magnetic material. For example, first fastening body 51 is an iron male screw. A first head portion 51H of first fastening body 51 may be exposed to an opposite side to insulating member 3 with respect to circuit board 1. First head portion 51H may be exposed to air. When conductive wire 4 is wound around first fastening body 51, the self-impedance of conductive wire 4 is improved, so that the high-frequency impedance of conductive wire 4 is improved. When conductive wire 4 is wound around first fastening body 51, heat may be generated in first fastening body 51 due to iron loss. The heat generated by the iron loss of first fastening body 51 may be cooled from first head portion 51H. The heat generated by the iron loss of first fastening body 51 may be cooled by either natural air cooling or forced air cooling. Accordingly, quality of connection structure 100 and the electric apparatus having connection structure 100 can be improved.

Second fastening body 52 fixes second portion $3b$ and housing 2. Second fastening body 52 is a second screw to be screwed into second screw hole 3d. The second screw is the male screw. The second screw may be a general-purpose product. The material of second fastening body 52 is a magnetic material. For example, second fastening body 52 is the male screw. When conductive wire 4 is wound around second fastening body 52, the self-impedance of conductive wire 4 is improved, so that the high-frequency impedance of conductive wire 4 is improved. When conductive wire 4 is wound around second fastening body 52, the heat may be generated in second fastening body 52 due to the iron loss. The heat generated by the iron loss of second fastening body 52 may be radiated to housing 2. The heat radiated to housing 2 is radiated to the outside of housing 2. Thus, second fastening body 52 is effectively cooled. Consequently, the quality of connection structure 100 and the electric apparatus having connection structure 100 can be improved.

Third fastening body 53 fixes first end 4a and circuit board 1. Third fastening body 53 is a third screw to be screwed into the female screw provided on circuit board 1. The third screw is the male screw. The third screw may be a general-purpose product. The material of third fastening body 53 may be a magnetic material. For example, third fastening body 53 is the iron male screw.

Fourth fastening body 54 fixes second end 4b and housing 2. Fourth fastening body 54 is a fourth screw to be screwed into the female screw provided in housing 2. The fourth screw is the male screw. The fourth screw may be a general-purpose product. The material of the fourth fastening body 54 may be a magnetic material. For example, fourth fastening body 54 is the iron male screw.

With reference to FIG. 2, the high-frequency noise current flowing through connection structure 100 will be described below.

Circuit board 1 has stray capacitance parasitic capacitance) connected to the power conversion semiconductor element of power converter 11. When the power conversion semiconductor element such as the metal oxide semiconductor field effect transistor of power converter 11 performs a switching operation, a steep voltage fluctuation is generated. When the voltage fluctuation is applied to the stray capacitance, the high-frequency noise current is generated. The high-frequency noise current is proportional to time variation of the voltage and a stray capacitance value.

The high-frequency noise current selectively propagates through a place having the low high-frequency impedance. Thus, the high-frequency noise current flows out from power converter 11 such as the switching power supply. For example, the capacitance between the windings of the transformer in the switching power supply has the low high-frequency impedance. For example, the stray capacitance between the circuit patterns of circuit board 1 has the low high-frequency impedance. For example, the stray capacitance between the power conversion semiconductor element and a heat sink (not illustrated) has the low high-frequency impedance.

The high-frequency noise current flowing out of power converter 11 reaches conductive wire 4 through the place having the low high-frequency impedance. The high-frequency noise current can propagate to housing 2 through conductive wire 4. In order to prevent the propagation of the high-frequency noise current to housing 2, conductive wire 4 needs to have the high high-frequency impedance. In the first embodiment, because conductive wire 4 is wound around insulating member 3, conductive wire 4 has the high high-frequency impedance.

Effects of the first embodiment will be described below.

According to connection structure 100 of the first embodiment, as illustrated in FIG. 2, the shortest distance along the surface of housing 2 from the position where conductive wire 4 and housing 2 are connected to contact 21 is shorter than the shortest distance along the surface of housing 2 from second portion 3b of insulating member 3 to contact 21. For this reason, the distance that the high-frequency noise current flows on the surface of housing 2 can be shortened as compared with the case where conductive wire 4 is fixed to housing 2 at the posit n of insulating member 3.

Thus, the high-frequency noise current can be prevented from circulating inside housing 2. When the high-frequency noise current circulates inside housing 2, a current loop is formed to generate radiation noise. According to connection structure 100 of the first embodiment, the high frequency noise current can be prevented from circulating inside housing 2, so that the generation of the radiation noise can be prevented. Accordingly, electromagnetic compatibility (EMC) of the electric apparatus having connection structure 100 is improved.

As illustrated in FIG. 2, connection structure 100 further includes first fastening body 51, second fastening body 52, third fastening body 53, and fourth fastening body 54. For this reason, circuit board 1, housing 2, insulating member 3, and conductive wire 4 can be fixed by the fastening body.

As illustrated in FIG. 2, first fastening body 51 is the first screw to be screwed into first screw hole 3c. Second fastening body 52 is a second screw to be screwed into second screw hole 3d. The first screw and the second screw are male screws. For this reason, the male screw that is a general-purpose product can be used for first fastening body 51 and second fastening body 52. The insulator that is a general-purpose product can be used as insulating member 3. Accordingly, the manufacturing cost of connection structure 100 can be reduced as compared with the case where connection structure 100 includes a conductive thread, an insulating core material, and a conductive tap spirally wound around the core material.

As illustrated in FIG. 2, insulating member 3 includes groove G provided over the entire circumference of the outer periphery. For this reason, the creepage distance of insulating member 3 is longer than the case where groove G is not provided in insulating member 3. Accordingly, the high-frequency noise current can be prevented from propagating from circuit board 1 to housing 2 along the surface of insulating member 3. Consequently, the generation of the radiation noise can be prevented.

As illustrated in FIG. 2, conductive wire 4 is configured to be deformable. For this reason, the position where circuit board 1 and housing 2 are electrically connected is not limited to the position of insulating member 3. Accordingly, the degree of freedom in design is improved.

Second Embodiment

Figure 3:
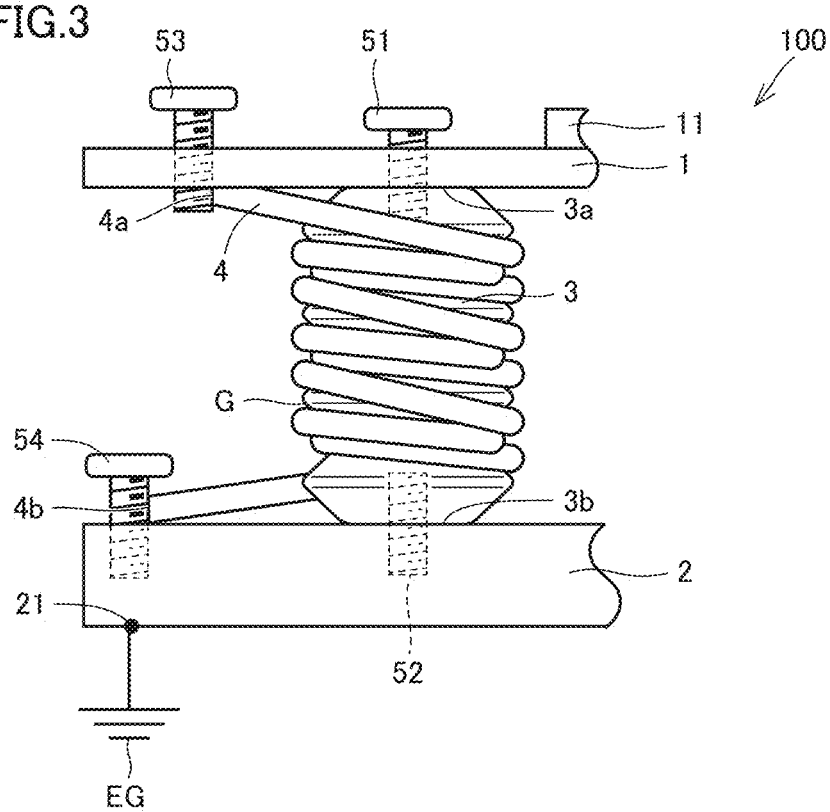
FIG. 3 is a partial side view schematically illustrating a configuration of a connection structure according to a second embodiment.

With reference to FIG. 3, a configuration of connection structure 100 according to a second embodiment will be described below. The second embodiment has the same configuration and effect as those of the first embodiment described above unless otherwise specified. Consequently, the same components as those in the first embodiment are denoted by the same reference numerals, and the description thereof will not be repeated.

As illustrated in FIG. 3, conductive wire 4 of the second embodiment is wound around groove G in a multiple manner. Conductive wire 4 is wound around groove G in the multiple manner along the circumferential direction of insulating member 3. For example, conductive wire 4 is wound in a triple manner along the circumferential direction of the insulating member of groove G. Conductive wire 4 constitutes a winding structure laminated in multiple layers.

Effects of the first embodiment will be described below.

According to connection structure 100 of the second embodiment, as illustrated in FIG. 3, conductive wire 4 is wound around groove G in the multiple manner. For this reason, conductive wire 4 has the higher self-inductance than the case where conductive wire 4 is singly wound around groove G. Accordingly, conductive wire 4 has the higher high-frequency impedance than the case where conductive wire 4 is singly wound around groove G. Accordingly, the high-frequency noise current can be prevented from flowing from circuit board 1 to housing 2 through conductive wire 4. Thus, electromagnetic environmental compatibility of the electric apparatus having connection structure 100 is improved.

As illustrated in FIG. 3, conductive wire 4 is wound around groove G in the multiple manner. For this reason, conductive wire 4 having a stable potential close to ground EG can be wound around insulating member 3 in a multiple manner. Accordingly, the generation of the high-frequency noise current due to the part of conductive wire 4 connected to housing 2 and the stray capacitance of second fastening body 52 can be prevented. For example, the potential of circuit board 1 can be displaced by a potential fluctuation during a switching operation of power converter 11 such as the switching power supply. However, the stray capacitance of the part of conductive wire 4 connected to circuit board 1 and the stray capacitance of first fastening body 51 are smaller than the stray capacitance of the part of conductive wire 4 connected to housing 2 and the stray capacitance of second fastening body 52. For this reason, the impedance of the part of conductive wire 4 connected to circuit board 1 and the impedance of first fastening body 51 are higher than the impedance of the part of conductive wire 4 connected to housing 2 and the impedance of second fastening body 52. Accordingly, the generation of the high-frequency noise current can be prevented in circuit board 1. Consequently, the electromagnetic compatibility of the electric apparatus having connection structure 100 is improved.

Third Embodiment

With reference to FIG. 4, a configuration of connection structure 100 according to a third embodiment will be described below. The third embodiment has the same configuration and effect as those of the first embodiment described above unless otherwise specified. Consequently, the same components as those in the first embodiment are denoted by the same reference numerals, and the description thereof will not be repeated.

As illustrated in FIG. 4, connection structure 100 of the third embodiment further includes at least one coupling body 6. Insulating member 3 includes a plurality of insulating portions 30. The plurality of insulating portions 30 are laminated from circuit board 1 toward housing 2. The plurality of insulating portions 30 are laminated along the axial direction of insulating member 3. The plurality of insulating portions 30 are arranged in series. Adjacent insulating portions 30 among the plurality of insulating portions 30 are connected by at least one coupling body 6. For example, each of the plurality of insulating portions 30 is the insulator that is a general-purpose product.

Each of the plurality of insulating portions 30 includes a plurality of grooves G provided over the entire circumference of the outer periphery. The plurality of insulating portions 30 may have the same structure.

In the third embodiment, the plurality of insulating portions 30 include a first insulating portion 31, a central insulating portion 32, and a second insulating portion 33. First insulating portion 31, central insulating portion 32, and second insulating portion 33 are sequentially laminated from circuit board 1 toward housing 2. First insulating portion 31 is fixed to circuit board 1. First insulating portion 31 is connected to central insulating portion 32 by coupling body 6. Central insulating portion 32 is sandwiched between first insulating portion 31 and second insulating portion 33. Second insulating portion 33 is fixed to housing 2. Second insulating portion 33 is connected to central insulating portion 32 by coupling body 6. First portion 3a is disposed in first insulating portion 31. Second portion 3b is disposed in second insulating portion 33.

The at least one coupling body 6 is disposed inside the plurality of insulating portions 30. Coupling body 6 connects adjacent insulating portions 30 to each other. Coupling body 6 is embedded across adjacent insulating portions 30. Coupling body 6 extends along the axial direction of insulating member 3 inside adjacent insulating portions 30. In the third embodiment, because three insulating portions 30 are disposed, two coupling bodies 6 are disposed.

The at least one coupling body 6 is a magnetic material. Coupling body 6 may be a general-purpose product. For example, coupling body 6 may be an iron male screw. The material of coupling body 6 may be ferrite or the like that is a ferromagnetic material.

Conductive wire 4 is wound around the plurality of insulating portions 30 around at least one coupling body 6. Conductive wire 4 is wound around the plurality of insulating portions 30 across the plurality of insulating portions 30. Conductive wire 4 is wound around each of the plurality of grooves G provided in each of the plurality of insulating portions 30.

In FIG. 4, the winding is wound around insulating portion 30 in a single form, but the method for winding conductive wire 4 is not limited to the single form. As will be described later in a fourth embodiment and a fifth embodiment, conductive wire 4 may be wound in a multiple manner.

Effects of the first embodiment will be described below.

According to connection structure 100 of the third embodiment, as illustrated in FIG. 4, insulating member 3 includes the plurality of insulating portions 30. The plurality of insulating portions 30 are laminated from circuit board 1 toward housing 2. For this reason, the axial dimension of insulating member 3 can be changed more easily than the case where insulating member 3 is made of only one member. Accordingly, the distance between circuit board 1 and housing 2 can be easily changed, so that the degree of freedom in designing connection structure 100 is improved.

As illustrated in FIG. 4, insulating member 3 includes the plurality of insulating portions 30. Each of the plurality of insulating portions 30 may be the insulator that is a general-purpose product. For this reason, the manufacturing cost of connection structure 100 can be reduced.

As illustrated in FIG. 4, connection structure 100 includes at least one coupling body 6. Coupling body 6 is a magnetic material. Conductive wire 4 is wound around the plurality of insulating portions 30 around at least one coupling body 6. For this reason, coupling body 6 is surrounded by a winding structure constituted by conductive wire 4. Thus, coupling body 6 adds a magnetic path inside the winding structure.

Accordingly, the self-impedance of conductive wire 4 increases. Accordingly, the high-frequency noise current can be prevented from flowing from circuit board 1 to housing 2 through conductive wire 4. Thus, electromagnetic environmental compatibility of the electric apparatus having connection structure 100 is improved.

Fourth Embodiment

With reference to FIG. 5, a configuration of connection structure 100 according to a fourth embodiment will be described below. The fourth embodiment has the same configuration and effect as those of the third embodiment described above unless otherwise specified. Consequently, the same components as those in the third embodiment are denoted by the same reference numerals, and the description thereof will not be repeated.

As illustrated in FIG. 5, in the fourth embodiment, conductive wire 4 is wound around at least one of the plurality of insulating portions 30 in a multiple manner. Conductive wire 4 is multiply wound around groove G of at least one insulating portion 30 among the plurality of insulating portions 30 in a multiple manner. Density of conductive wire 4 wound around insulating portion 30 may be appropriately adjusted.

The density of conductive wire 4 wound around central insulating portion 32 may be higher than the density of conductive wire 4 wound around first insulating portion 31 and the density of conductive wire 4 wound around second insulating portion 33. Conductive wire 4 may be wound around central insulating portion 32 by concentrated winding. In the fourth embodiment, conductive wire 4 being wound around central insulating portion 32 by concentrated winding means that conductive wire 4 is wound around central insulating portion 32 more than first insulating portion. 31 and second insulating portion 33. Conductive wire 4 may be wound around insulating portion 30 disposed at the center in the axial direction of insulating member 3 among the plurality of insulating portions 30 by concentrated winding.

Effects of the first embodiment will be described below.

According to connection structure 100 of the fourth embodiment, as illustrated in FIG. 5, conductive wire 4 is wound around at least one of the plurality of insulating portions 30 in a multiple manner. For this reason, the density of conductive wire 4 wound around insulating portion 30 can be appropriately adjusted. Accordingly, conductive wire 4 can be wound around insulating portion 30 disposed at the center in the axial direction of insulating member 3 among the plurality of insulating portions 30 by concentrated winding. Insulating portion 30 disposed at the center in the axial direction of insulating member 3 has higher workability than insulating portion 30 disposed at the end in the axial direction of insulating member 3. As a result, the workability winding conductive wire 4 around insulating portion 30 is improved, so that assemblability of connection structure 100 is improved. Accordingly, the manufacturing cost of connection structure 100 can be reduced.

Fifth Embodiment

With reference to FIG. 6, a configuration of connection structure 100 according to a fifth embodiment will be described below. The fifth embodiment has the same configuration and effect as those of the third embodiment described above unless otherwise specified. Consequently, the same components as those in the third embodiment are denoted by the same reference numerals, and the description thereof will not be repeated.

As illustrated in FIG. 6, conductive wire 4 of the fifth embodiment is wound around the plurality of insulating portions 30 in a multiple manner around at least one coupling body 6. Conductive wire 4 is wound around the plurality of insulating portions 30 along the circumferential direction of the plurality of insulating portions 30 in a multiple manner around the at least one coupling body 6.

Effects of the first embodiment will be described below.

According to connection structure 100 of the fifth embodiment, conductive wire 4 is wound around the plurality of insulating portions 30 in a multiple manner around at least one coupling body 6. For this reason, the leakage magnetic flux generated from conductive wire 4 is concentrated around coupling body 6. Accordingly, the leakage magnetic flux generated from conductive wire 4 forms a magnetic flux loop around coupling body 6. When the magnetic flux loop reaches circuit board 1, a malfunction of an electronic component (not illustrated) mounted on circuit board 1 may be induced, so that the malfunction may be generated in the electric apparatus in which circuit board 1 is incorporated. According to the fifth embodiment, the magnetic flux loop of the leakage magnetic flux is formed around coupling body 6, so that the magnetic flux loop can be prevented from reaching circuit board 1. Accordingly, the malfunction of circuit board 1 can be prevented. Consequently, the reliability of the electric apparatus including circuit board 1 of connection structure 100 is improved.

It should be considered that the disclosed embodiments are an example in all respects and not restrictive. The scope of the present disclosure is defined by not the description above, but the claims, and it is intended that all modifications within the meaning and scope of the claims and their equivalents are included in the present invention.

REFERENCE SIGNS LIST

1: circuit board, 2: housing, 3: insulating member, 3a: first portion, 3b: second portion, 4: conductive wire, 4a: first end, 4b: second end, 6: coupling body, 21: contact, 30: insulating portion, 51: first fastening body, 52: second fastening body, 53: third fastening body, 54: fourth fastening body, 100: connection structure, G: groove

The invention claimed is:

1. A connection structure comprising:
   a circuit board;
   an insulating member to include a first portion fixed to the circuit board and a second portion facing the first portion;
   a housing to which the second portion is fixed, the housing including a contact that is grounded; and
   a conductive wire to electrically connect the circuit board and the housing while being wound around the insulating member,
   wherein a shortest distance along a surface of the housing from a position where the conductive wire and the housing are connected to the contact is shorter than a shortest distance along a surface of the housing from the second portion of the insulating member to the contact.

2. The connection structure according to claim 1, further comprising:
   a first fastening body;
   a second fastening body;
   a third fastening body; and a fourth fastening body,
wherein the conductive wire includes a first end electrically connected to the circuit board and a second end electrically connected to the housing,
the first fastening body fixes the first portion and the circuit board,
the second fastening body fixes the second portion and the housing,
the third fastening body fixes the first end and the circuit board, and
the fourth fastening body fixes the second end and the housing.

3. The connection structure according to claim 2, wherein a first screw hole is made in the first portion,
a second screw hole is made in the second portion,
the first fastening body is a first screw to be screwed into the first screw hole, and
the second fastening body is a second screw to be screwed into the second screw hole.

4. The connection structure according to claim 1, wherein the insulating member includes a groove provided over an entire circumference of an outer periphery, and
the conductive wire is wound around the insulating member along the groove.

5. The connection structure according to claim 4, wherein the conductive wire is wound around the groove in a multiple manner.

6. The connection structure according to claim 1, further comprising at least one coupling body that is a magnetic material,
wherein the insulating member includes a plurality of insulating portions laminated from the circuit board toward the housing,
the at least one coupling body is disposed inside the plurality of insulating portions,
adjacent insulating portions among the plurality of insulating portions are connected to each other by the at least one coupling body, and
the conductive wire is wound around the plurality of insulating portions around the at least one coupling body.

7. The connection structure according to claim 6, wherein the conductive wire is wound around at least one of the plurality of insulating portions in a multiple manner.

8. The connection structure according to claim 6, wherein the conductive wire is wound around the plurality of insulating portions in a multiple manner around the at least one coupling body.

* * * * *